US009842656B2

(12) United States Patent
Kojima

(10) Patent No.: US 9,842,656 B2
(45) Date of Patent: Dec. 12, 2017

(54) SEMICONDUCTOR MEMORY DEVICE AND VERIFICATION METHOD FOR INPUT DATA

(71) Applicant: Winbond Electronics Corp., Taichung (TW)

(72) Inventor: Hidemitsu Kojima, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/256,745

(22) Filed: Sep. 6, 2016

(65) Prior Publication Data

US 2017/0256322 A1    Sep. 7, 2017

(30) Foreign Application Priority Data

Mar. 4, 2016 (JP) ................. 2016-041653

(51) Int. Cl.
| | |
|---|---|
| G11C 16/04 | (2006.01) |
| G11C 16/34 | (2006.01) |
| G11C 16/26 | (2006.01) |
| G11C 16/10 | (2006.01) |
| G11C 16/08 | (2006.01) |

(52) U.S. Cl.
CPC ...... *G11C 16/3459* (2013.01); *G11C 16/0483* (2013.01); *G11C 16/08* (2013.01); *G11C 16/10* (2013.01); *G11C 16/26* (2013.01)

(58) Field of Classification Search
CPC . G11C 16/04; G11C 16/3459; G11C 16/0483; G11C 16/08; G11C 16/10
USPC .................................................. 365/185.12
See application file for complete search history.

(56) References Cited

U.S. PATENT DOCUMENTS

2004/0205429 A1* 10/2004 Yoshida ................. G11C 29/26
714/718
2006/0179378 A1* 8/2006 Lida ....................... G11O 5/147
714/733
(Continued)

FOREIGN PATENT DOCUMENTS

JP    2001256791    9/2001
JP    2011253591    12/2011
(Continued)

OTHER PUBLICATIONS

"Office Action of Japan Counterpart Application" with English translation thereof, dated Nov. 22, 2016, p. 1-p. 15.
(Continued)

*Primary Examiner* — Harry W Byrne
(74) *Attorney, Agent, or Firm* — JCIPRNET

(57) ABSTRACT

A semiconductor memory device and a verification method which can verify data taken inside external terminals are provided. The semiconductor memory device of the invention includes external input/output terminals for inputting or outputting data, a memory array 110 and a page buffer/sensing circuit 170. The page buffer/sensing circuit 170 holds input data inputted from the external input/output terminals and the held input data can be programmed to the memory array 110. Further, the semiconductor memory device includes comparing circuit 132. The comparing circuit 132 compares input data held in the page buffer/sensing circuit 170 and the input data read from the page buffer/sensing circuit 170.

16 Claims, 9 Drawing Sheets

(56) References Cited

U.S. PATENT DOCUMENTS

| | | | | |
|---|---|---|---|---|
| 2007/0234120 A1* | 10/2007 | Yoshida | ................ | G11C 29/26 714/30 |
| 2011/0116310 A1* | 5/2011 | Yamazaki | .............. | G11C 7/062 365/182 |
| 2011/0128777 A1* | 6/2011 | Yamazaki | ............. | G11C 11/405 365/149 |
| 2011/0175660 A1* | 7/2011 | Matano | ................ | G11C 7/062 327/306 |
| 2014/0092681 A1* | 4/2014 | Yamazaki | .............. | G11C 7/062 365/182 |

FOREIGN PATENT DOCUMENTS

| | | |
|---|---|---|
| JP | 2016507125 | 3/2016 |
| KR | 20140028945 | 3/2014 |
| WO | 2014110077 | 7/2014 |

OTHER PUBLICATIONS

"Office Action of Korea Counterpart Application," with English translation thereof, dated Jul. 6, 2017, p. 1-p. 22.

* cited by examiner

SEMICONDUCTOR MEMORY DEVICE AND VERIFICATION METHOD FOR INPUT DATA

CROSS-REFERENCE TO RELATED APPLICATION

This application claims the priority benefit of Japan application serial no. 2016-041653, filed on Mar. 4, 2016. The entirety of the above-mentioned patent application is hereby incorporated by reference herein and made a part of this specification.

BACKGROUND OF THE INVENTION

1. Field of the Invention

The invention relates to a semiconductor storage device, and more particularly, to a verification method for input data of NAND or NOR flash memory.

2. Description of Related Art

In a program operation of the NAND flash memory, a programming voltage with high voltage (15 V to 20 V) is applied to a selected word line, an intermediate potential (e.g., 10 V) is applied to a non-selected word line, and a potential corresponding to data "0" or "1" to be programmed is supplied to a bit line. Accordingly, elections are moved from a channel through via a gate insulation layer to a floating gate of a selected memory cell (e.g., Patent Document 1).

PRIOR ART DOCUMENT

Patent Document

Patent Document 1: Japanese Patent Publication No. 2011-253591

Problems to be Solved by the Invention

FIG. 1 shows a structure of major parts of an NAND flash memory. In FIG. 1, one transmission path between an external input/output terminal 10 and a page buffer/sensing circuit 30 is illustrated. The transmission path includes: an input buffer 22A, inputting data from the input/output terminal 10; an input line 24A, moving input data from a single end of the input buffer 22A; and a driver 26A, converting the data of the single end into differential data, and supplying the differential data to the page buffer/sensing circuit 30 via data lines DL and /DL. Also, the transmission path further include: a driver 26B, converting the differential data from the page buffer/sensing circuit 30 into the data of the single end; an output buffer 22B, outputting the converted data; and an output line 24B, moving the input data outputted from the output buffer 22B to the input/output terminal 10.

The external input/output terminal 10 is commonly used by a command, an address and an input/output data. However, identification of those data are performed according to external control signals (e.g., a command latch enable signal, an address latch enable signal, etc.) which are not illustrated herein. For example, when the command latch enable signal is at H potential and the address enable signal is at L potential, the data at the external input/output terminal 10 is identified as the command. The command is held in a latch circuit 42 of a controller 40 via the input buffer 22A. The controller 40 interprets the command held in the latch circuit 42 in order to control a program operation, a read operation or an erase operation. Further, when the address enable signal is at H potential and the command enable signal is at L potential, the data at the external input/output terminal 10 is identified as the address. The address is held in an address register (not illustrated) via the input buffer 22A. When the address enable signal is at L potential and the command enable signal is at L potential, the data at the external input/output terminal 10 is loaded to the page buffer/sensing circuit 30 via the input buffer 22A, the input line 24A and the driver 26A.

FIG. 2 shows a timing chart when the input data is loaded to the page buffer/sensing circuit. Herein, it is assumed that a program command and an address are already inputted. Data may be inputted to the page buffer/sensing circuit 30 when a write enable signal WEN is at H potential, and the data may be outputted therefrom in case of L potential. A data transmission between the driver 26A (or 26B) and the data line DL (or /DL) may be performed when a PCB signal is at H potential, and a column address of the page buffer/sensing circuit 30 may be selected when a YA signal is at H potential. As shown in FIG. 2, input data D0, D1, D2 and D3 inputted to the external input/output terminal 10 are loaded to column addresses A, A+1, A+2 and A+3 of the page buffer (PB)/sensing circuit 30, respectively.

Next, the data loaded in the page buffer/sensing circuit 30 are programmed to a page selected by a column selection circuit. Thereafter, a programming verification for determining whether the programming is successful is performed. The programming verification is to apply a verification voltage to the selected page for reading and then verify whether a threshold of a memory cell falls within a distribution range of "0". If not reaching the distribution range of "0", the memory cell is determined as unqualified, and a program pulse greater than the previous pulse by ΔV is applied to that memory cell again. Under the circumstance where the memory cell is still determined as unqualified despite a number of times for applying the program pulse reached a predetermined number of times, a block including the selected page is considered as a bad block for management.

As such, in the conventional flash memory, whether the input data is correctly programmed to the selected page may be checked by the programming verification when programming the input data. Nonetheless, if a part of the page buffer/sensing circuit 30 shows failures, or if the transmission path between the external input/output terminal 10 and the page buffer/sensing circuit 30 shows failures, the input data will not be correctly loaded in the page buffer/sensing circuit 30 and thus incorrect data may be programmed as a result. With advancements in miniaturization of transistors in the future, when taking into consideration of the followings: failures generated by transistors in the latch circuit constituting the page buffer/sensing circuit 30 or its unstable operations being performed; defects or malfunctions (e.g., short circuit or open circuit) generated on the transmission path from the external input/output terminal 10 to the page buffer/sensing circuit 30; or possibility of damages on data caused by noises due to the high data transmission speed or power voltage variations, it is required to verify data inputted from the external input/output terminal to the page buffer/sensing circuit. This is a common problem for the NAND flash memory as well as for the semiconductor storage device configured to store data inputted from the external terminal to the memory.

SUMMARY OF THE INVENTION

In order to solve aforesaid conventional problem, the invention aims to provide a semiconductor storage device with functions capable of verifying input data taken inside from the external terminal.

Technical Means for Solving the Problem

A semiconductor memory device of the invention includes: an external terminal; a memory array; a data holding component, holding input data inputted from the external terminal, and capable of programming the held input data to the memory array; and a comparison component, comparing the input data held in the data holding component from the external terminal with the input data read from the data holding component. Preferably, the comparison component is operated when programming the input data. Preferably, the comparison component compares the input data of a same column address of the data holding component. Preferably, the data holding component is connected to the external terminal via an input line and an output line, and the comparison component compares the input data transmitted on the input line with the input data transmitted on the output line. Preferably, the comparison component is operated in a test mode. Preferably, the semiconductor storage device further includes: a determination component, determining whether the data holding component is malfunction based on a comparison result of the comparison component. Preferably, the semiconductor storage device further includes a control component for controlling operations of the semiconductor storage device, the control component including a holding circuit capable of holding a command inputted from the external terminal, the comparison component comparing the input data held in the holding circuit with the input data read from the data holding component. Preferably, the control component re-inputs the data held in the holding circuit to the data holding circuit when the data are determined as inconsistent by the comparison component.

A verification method for input data of the invention is a verification method for input data of a semiconductor storage device. The semiconductor storage device includes an external terminal, a data holding component holding input data inputted from the external terminal, and a memory array component connected to the data holding component. The verification method for input data includes steps of: loading the input data from the external terminal to the data holding component; reading the input data loaded in the data holding component; and comparing the input data held in the data holding component with the input data read from the data holding component.

Preferably, the step of comparing is performed when programming the input data. Preferably, the step of loading and the step of reading are performed in one data input cycle. Preferably, the step of comparing is performed in a test mode. Preferably, the verification method further includes a step of determining whether the data holding component is malfunction based on a comparison result of the step of comparing. Preferably, the step of loading includes a step of holding the input data transmitted on an input line, and the step of comparing compares the held input data with the input data read from the data holding component. Preferably, the verification method further includes a step of re-inputting the data held by the step of holding to the data holding circuit when the input data are determined as inconsistent by the step of comparing.

Effect of the Invention

According to the invention, with the configuration of the comparison component capable of comparing the input data held in the data holding component from the external terminal with the input data read from the data holding component, whether the input data is correctly held in the data holding component can be verified.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
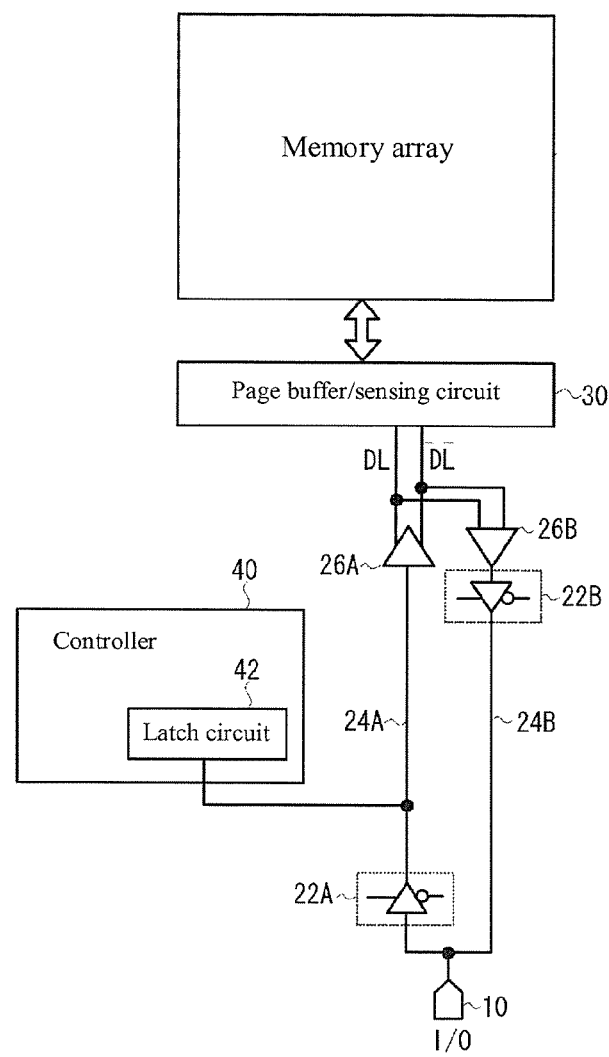
FIG. 1 is a block diagram showing a structure of major parts of an NAND flash memory in conventional art.
Figure 2:
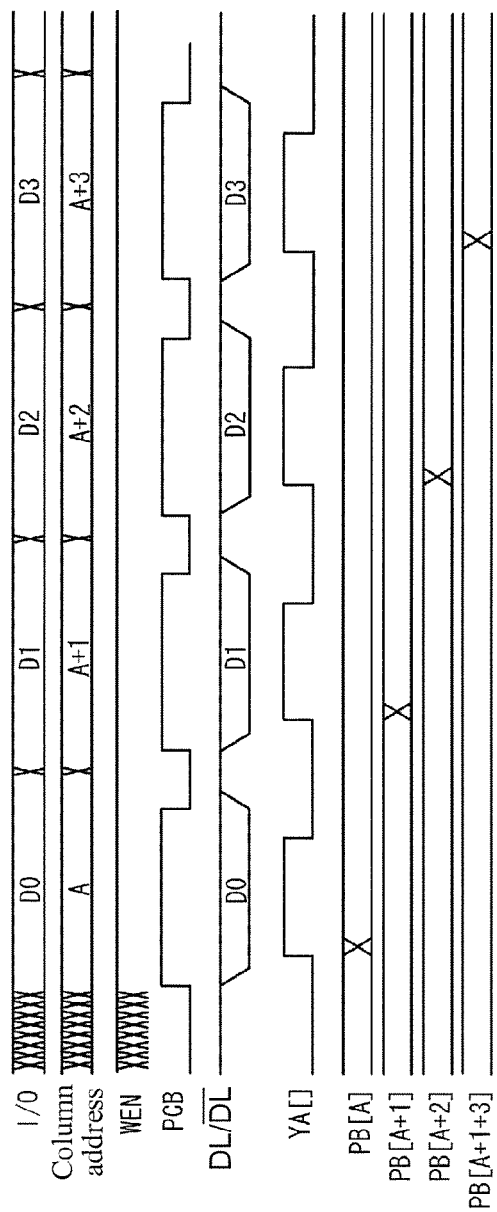
FIG. 2 is a timing chart illustrating the operations performed when the input data of the flash memory in conventional art is loaded to the page buffer/sensing circuit.

Reference will now be made in detail to the present preferred embodiments of the invention, examples of which are illustrated in the accompanying drawings. Wherever possible, the same reference numbers are used in the drawings and the description to refer to the same or like parts.

Embodiments of the invention are described in detail below by reference with accompanied drawings. Here, an NAND flash memory is illustrated as the preferred embodiment. In addition, it should be noted that parts of the accompanied figures are exaggerated to emphasize on certain features to make it more apparent for understanding, and the scales thereof are different from the actual devices.

Embodiments

Figure 3:
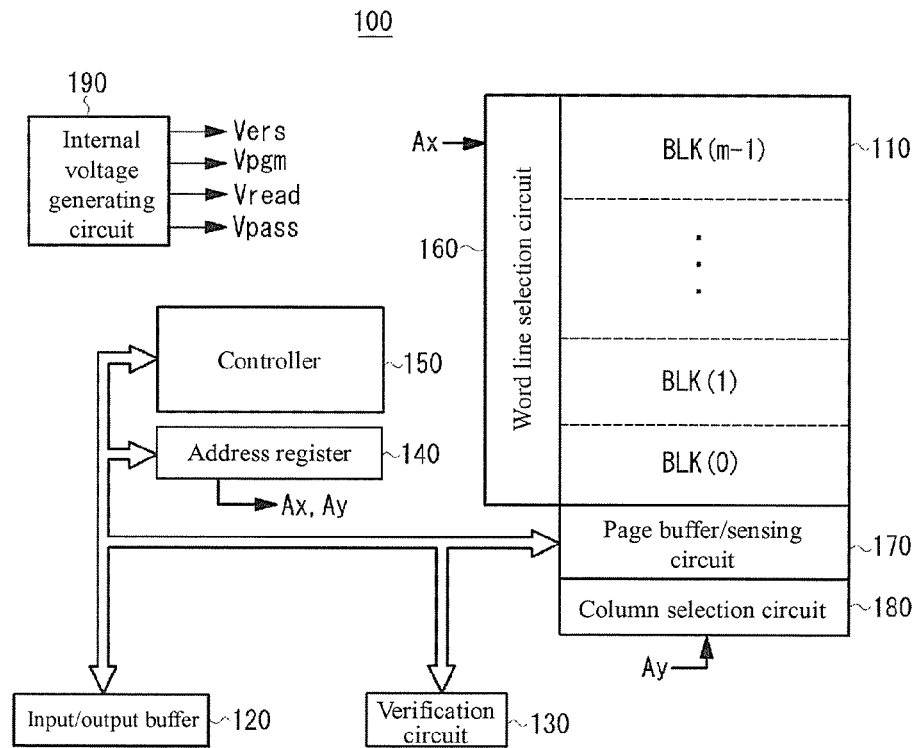
FIG. 3 is a schematic diagram illustrating an overall structure of an NAND flash memory according to an embodiment of the invention.

A structure of major parts of the NAND flash memory according to an embodiment of the invention is depicted in FIG. 3. However, the structure of the flash memory shown herein is merely an example, and the invention is not necessarily limited to such structure. A flash memory 100 of the present embodiment includes: a memory array 110, formed by a plurality of memory cells arranged in matrix; an input/output buffer 120, connected to an external input/output terminal I/O; a verification circuit 130, verifying input data inputted from an external input/output terminal I/O; an address register 140, receiving address information from the input/output buffer 120; a controller 150, receiving commands, data and the like from the input/output buffer 120 to control each part; a word line selection circuit 160, receiving row address information Ax from the address register 140, decoding the row address information Ax, and performing a block selection and a word line selection and the like based on a decoding result thereof; a page buffer/sensing circuit 170, holding data read from a page selected by the word line selection circuit 160, or holding data to be written to the selected page; a column selection circuit 180, receiving column address information Ay from the address register 140, decoding the column address information Ay, and selecting data in the page buffer/sensing circuit 170 based on a decoding result; an internal voltage generating circuit 190, generating various voltages (a write voltage Vpgm, a pass voltage Vpass, a read pass voltage Vread, an erase voltage Vers, etc.) required for reading, programming and erasing data.

Figure 4:
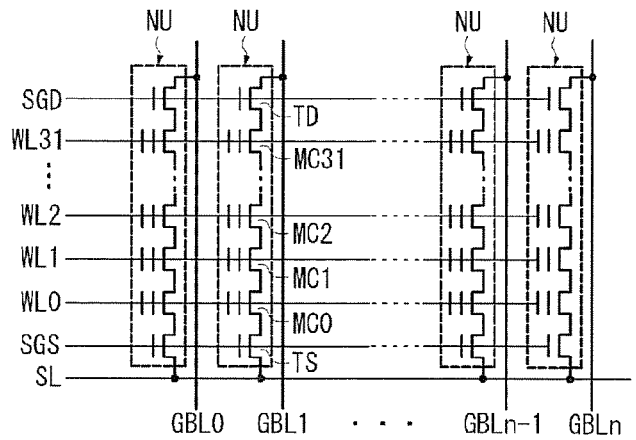
FIG. 4 is a circuit diagram showing a structure of an NAND string of a memory cell array according to an embodiment of the invention.

The memory array 110 has m storage blocks BLK(0), BLK(1), . . . , and BLK(m-1) in a column direction. The page buffer/sensing circuit 170 is disposed adjacent to the block BLK(0). In one storage block, as shown in FIG. 4, a plurality of NAND strings NU is formed, and the NAND string NU is formed by a plurality of memory cells connected in series. One NAND string NU includes: a plurality of memory cells connected in series MCi (i=0, 1, . . . , 31), a bit line side selection circuit TD and a source line side selection circuit TS. A drain of the bit line side selection transistor TD is connected to one corresponding bit line among bit lines GBL0 to GBLn, and a source of the source line selection transistor TS is connected to a common source line SL.

A control gate of the memory cell MCi is connected to a word line WLi, and gates of the selection transistors TD and TS are connected to selection gate lines SGD and SGS in parallel with the word lines WLi, respectively. The word line selection circuit 160 drives the selection transistors TD and TS via the selection gate lines SGS and SGD based on the row address information Ax in order to select the block or the word line.

The memory cell typically includes a MOS (Metal Oxide Semiconductor) structure, and the MOS structure includes: source/drain, serving as an N-type diffusion region and formed inside a P-well; a tunnel oxide film, formed on a channel between the source/drain; a floating gate (a charge accumulation layer), formed on the tunneling oxide film; and a control gate, formed on the floating gate through a dielectric film. When charges are not accumulated in the floating gate (i.e., when data "1" is written), the threshold is in a negative state. When charges are accumulated in the floating gate (i.e., when data "0" is written), the threshold shifts to positive. The memory cell may be a SLC (Single Level Cell) type capable of storing one bit (binary data) and may also be a MLC (Multi Level Cell) type capable of storing multiple bits.

Table 1 is a table showing bias voltages applied in each operation of the flash memory. In a read operation, a positive voltage is applied to the bit line; 0 V is applied to the selected word line, for example; the pass voltage Vpass (e.g., 4.5 V) is applied to a non-selected word line; a positive voltage (e.g., 4.5 V) is applied to the selection gate lines SGD and SGS to turn on the bit line side selection transistor TD and the source line side selection transistor TS; and 0 V is applied to the common source line. In a program (write) operation, the program voltage Vpgm with high voltage (15 V to 20 V) is applied to the selected word line; an intermediate potential (e.g., 10 V) is applied to the non-selected word line to turn on the bit line selection transistor TD, turn off the source line selection transistor TS, and supply a potential corresponding to data of "0" or "1" to the bit line GBL. In an erase operation, 0 V is applied to the selected word line in the block, and a high voltage (e.g., 21 V) is applied to the P-well to extract electrons of the floating gate to a substrate, so as erase data using block as a unit.

TABLE 1

|  | Erasing | Writing | Reading |
| --- | --- | --- | --- |
| Selected word line | 0 | 15~20 V | 0 |
| Non-selected word line | F | 10 V | 4.5 |
| SGD | F | Vcc | 4.5 |
| SGS | F | 0 | 4.5 |
| SL | F | Vcc | 0 |
| P-well | 21 | 0 | 0 |

Figure 5:
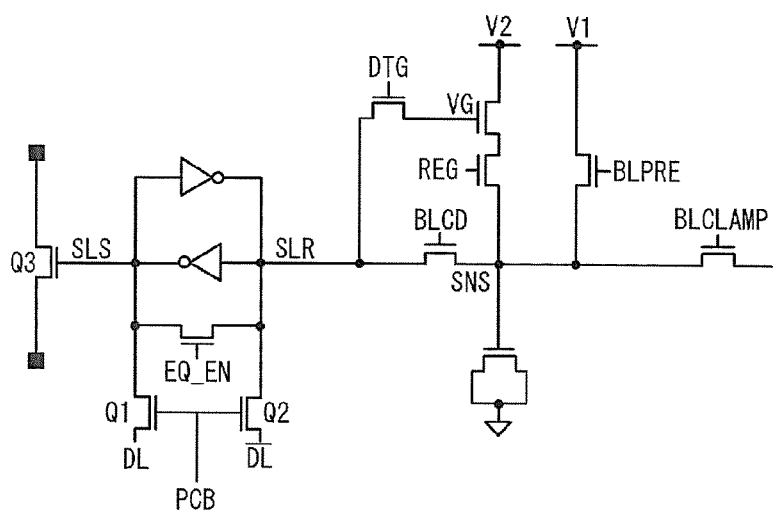
FIG. 5 is a diagram showing a structure of the page buffer/sensing circuit according to the present embodiment.

FIG. 5 is a diagram showing a structure of the page buffer/sensing circuit. The page buffer/sensing circuit 170 includes: a sensing circuit, sensing a bit line potential of the memory cell in the read operation, etc.; and a latch circuit, holding the input data to be programmed or data read from the memory array, etc. The sensing circuit includes: a transistor BLPRE for pre-charging a voltage supplied from a voltage supplier V1 to the bit line, a transistor BLCLAMP for clamping the bit line, a transistor BLCD for transmitting charges between a sense node SNS and a latch node SLR, a transistor DTG for transmitting a potential of the latch node SLR to a node VG connected to a voltage supplier V2, and a transistor REG for coupling the voltage supplier V2 to the sense node SNS. For example, the transistor DTG operates when it is required to invert the sense node SNS from L potential to H potential in the programming verification, etc. The latch circuit includes: a pair of cross coupled inverters; a transistor EQ_EN for equalizing the nodes SLR/SLS; transistors Q1 and Q2 for connecting to the nodes SLR/SLS to the data lines DL and/DL, respectively; and a verification transistor Q3 connected to the node SLS. A PCB signal is supplied to gates of the transistors Q1 and Q2.

Figure 6:
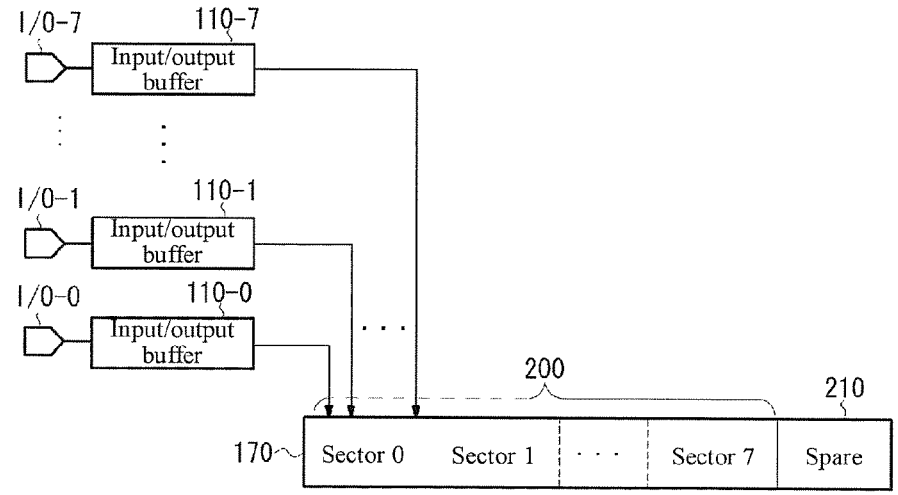
FIG. 6 is a diagram illustrating operations of loading data from input/output terminals to the page buffer/sensing circuit.

FIG. 6 is a diagram showing an example for loading the input data from the external input/output terminal to the page buffer/sensing circuit 170. For example, when the flash memory 100 has eight external input/output terminals, input data Di is loaded to the page buffer/sensing circuit 170 from respective one of external input/output terminals I/O-0 to I/O-7 via respective one of the input/output buffers 110-0 to 110-7. For example, the page buffer/sensing circuit 170 includes: a regular area 200 divided into eight sectors including Sector 0 to Sector 7; and a spare area 210.

One sector includes, for example, 256 bytes. In this case, the regular area 200 holds approximately 2K bytes of data in total. For example, the spare area 210 includes 64 bytes and holds information regarding user data or the bad block. The external input/output terminals I/O-0 to I/O-7 are assigned per one sector. That is, when the input data is loaded to one sector, 256 bits are assigned to one external input/output terminal (256 bits×8=1 sector). The column selection circuit 180 selects column addresses to be loaded for the data inputted to the external input/output terminals I/O-0 to I/O-7 based on the column address information Ay received in the program operation. FIG. 6 shows an example for loading the data inputted from the external input/output terminals I/O-0 to I/O-7 to Sector 0.

Figure 7:
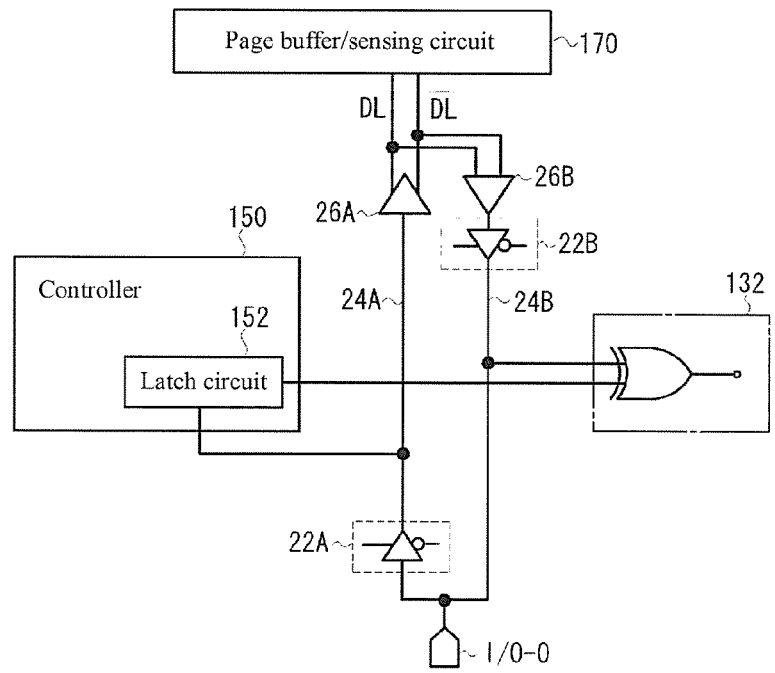
FIG. 7 is a diagram showing a structure of a verification circuit for verifying input data according to the first embodiment of the invention.

Next, the verification circuit 130 of the present embodiment is described as follows. The verification circuit 130 of the present embodiment can verify the input data inputted from the external input/output terminal. FIG. 7 shows a preferred structural example of the verification circuit 130. In addition, a transmission path shown in FIG. 7 has the same structure of the transmission path shown in FIG. 1. The verification circuit 130 includes a comparison circuit 132. The comparison circuit 132 inputs data held in a latch circuit 152 of the controller 150 and data read from the output line 24B and compares the two data. The comparison circuit 132 includes, for example, a coincidence circuit (EX-NOR). The controller 150 usually holds the command taken from the external input/output terminal in the latch circuit 152 and interpreting the same, but stays in an idle state when not inputting command (e.g., in a period in which the input data is loaded to the page buffer/sensing circuit 170). In the present embodiment, when the input data is loaded to the page buffer/sensing circuit 170 by utilizing the idle state of the latch circuit 152, the input data is held in latch circuit 152 in the meantime. Specifically, when receiving the program command and executing a program sequence based on the program command, the controller 150 holds the input data taken inside later from the external input/output terminal in the latch circuit 152. Further, shortly after the input data is loaded to the page buffer/sensing circuit 170, the controller 150 makes the data loaded from the page buffer/sensing circuit 170 to be read to the output line 24B and makes the comparison circuit 132 to compare the read data with the data held in the latch circuit 152. If the read data is inconsistent with the data held in the latch circuit 152, it can be expected that there is malfunction in the page buffer/sensing circuit 170 and/or the transmission path.

Figure 8:
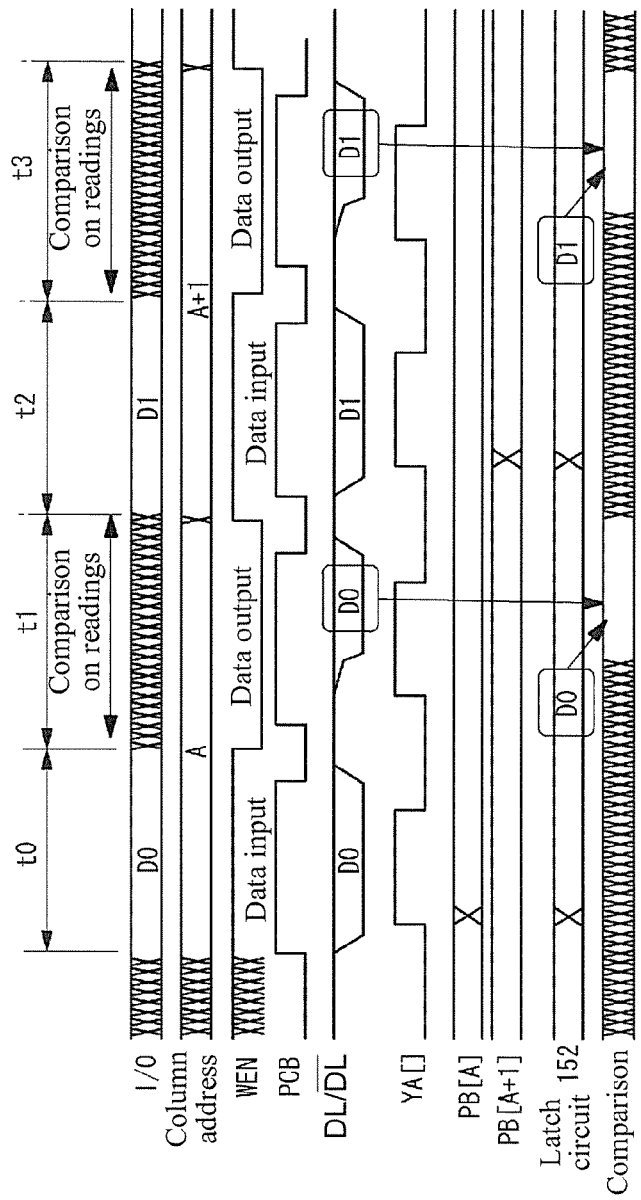
FIG. 8 is a timing chart for each part when verifying the input data according to the first embodiment of the invention.

FIG. 8 is a timing chart of the verification for the input data according to the present embodiment. In the present embodiment, when the input data is loaded inside, the loaded input data is verified within a period before the next input data is loaded. In other words, a data input cycle follows a verification cycle for the input data. FIG. 8, one data input cycle has a time period t0 and a time period t1. During the time period t0, input data D0 is taken inside from the external input/output terminal, and the input data D0 is loaded to a column address A of the page buffer/sensing circuit 170 selected by the column selection circuit 180. For example, as shown in FIG. 6, in the case of eight input/output terminals, the input data D0 is 8 bit data.

During the next time period t1, the input data D0 is verified. That is, the write enable signal WEN is transformed from H potential into L potential, the input data D0 held in the address A of the page buffer/sensing circuit 170 is read to the data lines DL and /DL, and the comparison circuit 132 compares the input data D0 held in the latch circuit 152 with the input data D0 read to the output line 24B. When a comparison result of the comparison circuit 132 indicates that the two data are inconsistent, a post-processing taken thereafter is arbitrary. For example, the comparison result may be provided to the controller 150 so the input data D0 may be loaded again to the page buffer/sensing circuit 170. Alternatively, a warning indicating presence of damages in the input data may be outputted to an external controller.

When loading and verifying of the input data D0 are completed, the next input data is then loaded. The next data input cycle includes a time period t2 and a time period t3. During the time period t2, input data D1 is held in the latch circuit 152, and loaded to a selected column address A+1 of the page buffer/sensing circuit 170. The column address A+1 may be an auto increment of the column address A and may also be provided from the outside. During the next time period t3, the input data D1 is verified the same way as described above.

Figure 9:
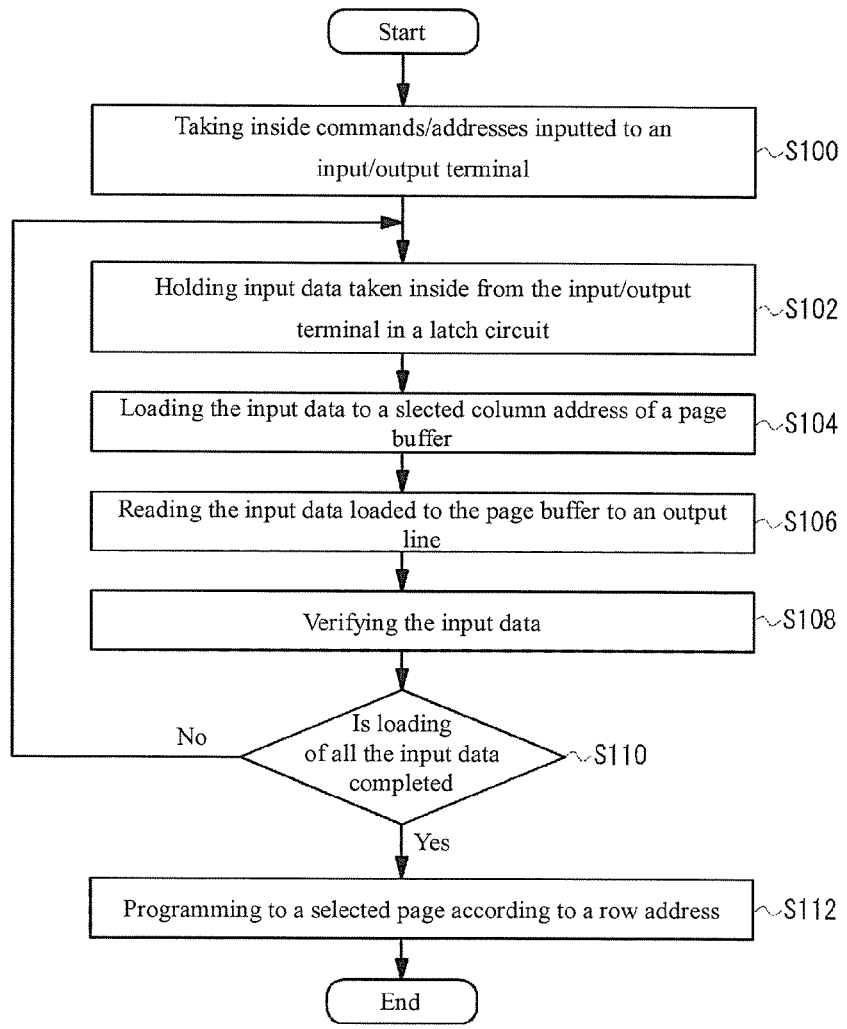
FIG. 9 is a flowchart illustrating a verification method for input data according to the first embodiment of the invention.

FIG. 9 is a process flow of the program operation according to the present embodiment. First of all, program commands and addresses are sequentially supplied from the external controller to the external input/output terminals of the flash memory 100, the program commands are held in the latch circuit 152, and the addresses are taken inside to the address register 140 (S100). The controller 150 interprets the program commands held in the latch circuit 152 and starts a program sequence. Next, input data is supplied form the external controller to the external input/output terminals of the flash memory 100, the input data are held in the latch circuit 152 via the input line 24A (S102), and loaded to a selected column address of the page buffer/sensing circuit 170 (S104). Next, the controller 150 makes the input data loaded in the page buffer/sensing circuit 170 to be outputted to the output line 24B (S106), and verifies the input data by making the comparison circuit 132 to compare the input data held in the latch circuit 152 with the input data outputted to the output line 24B (S108). When loading of all the input data is completed (S110), the input data held in the page buffers/sensing circuit 170 are programmed to a selected page (S112).

Here, when a verification result of the input data is unqualified (when the two data are determined as inconsistent by the comparison circuit), the controller 150 can re-input the input data held in the latch circuit 152 again to the page buffer/sensing circuit 170 for re-verification before programming. The re-inputting/re-verification may also be performed after all the input data are inputted. In that case, the latch circuit 152 can continuously held the input data until the re-verification begins. Further, the controller 150 may also output a signal indicating programming failures or physical malfunction to the external controller under the circumstance where a number of times of performing the re-inputting/re-verification reaches a specific number.

Figure 10:
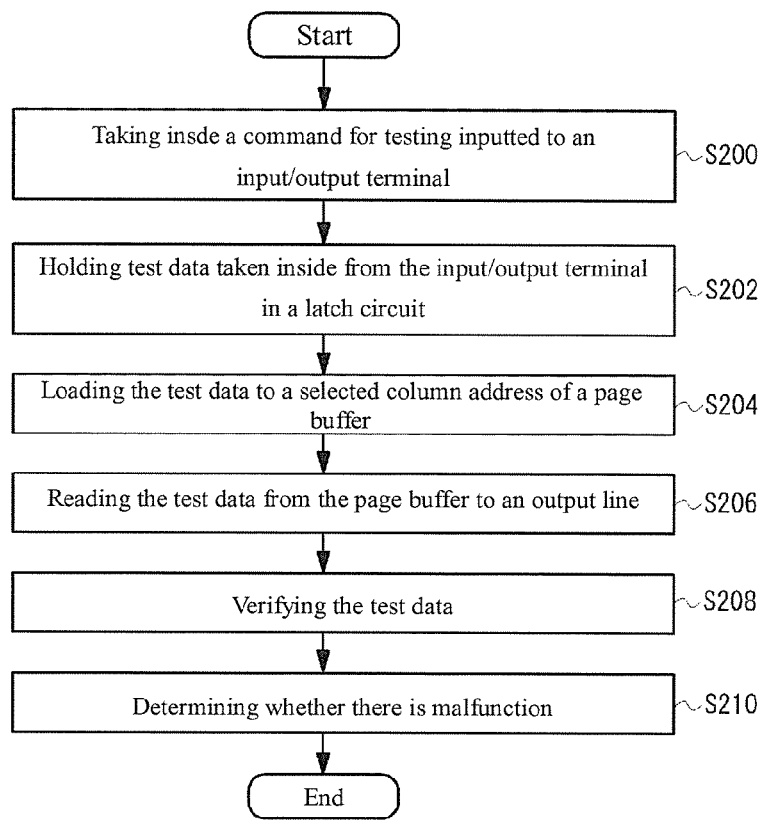
FIG. 10 is a flowchart illustrating a verification method for input data according to the second embodiment of the invention.

Next, a second embodiment of the invention is described below. The input data is verified in the program operation in the first embodiment, whereas the input data is verified in a test mode in the second embodiment. FIG. 10 shows a process flow of the verification method for input data according to the second embodiment. After a command for a test mode is received by the latch circuit 152 (S200), the controller 150 starts a sequence of the test mode. In the test mode, the test data is sent from the external controller to the external input/output terminals of the flash memory 100 so the test data is held in the latch circuit 152 (S202), and loaded to the page buffer/sensing buffer 170 (S204). Next, the test data is read to the page buffer/sensing circuit 170 to the output line 24B (S206), and the test data is verified by comparing the test data held in the latch circuit 152 with the test data outputted to the output line 24B by the comparison circuit 132 (S208). A verification result is provided for determining whether there is malfunction (S210).

Figure 11:
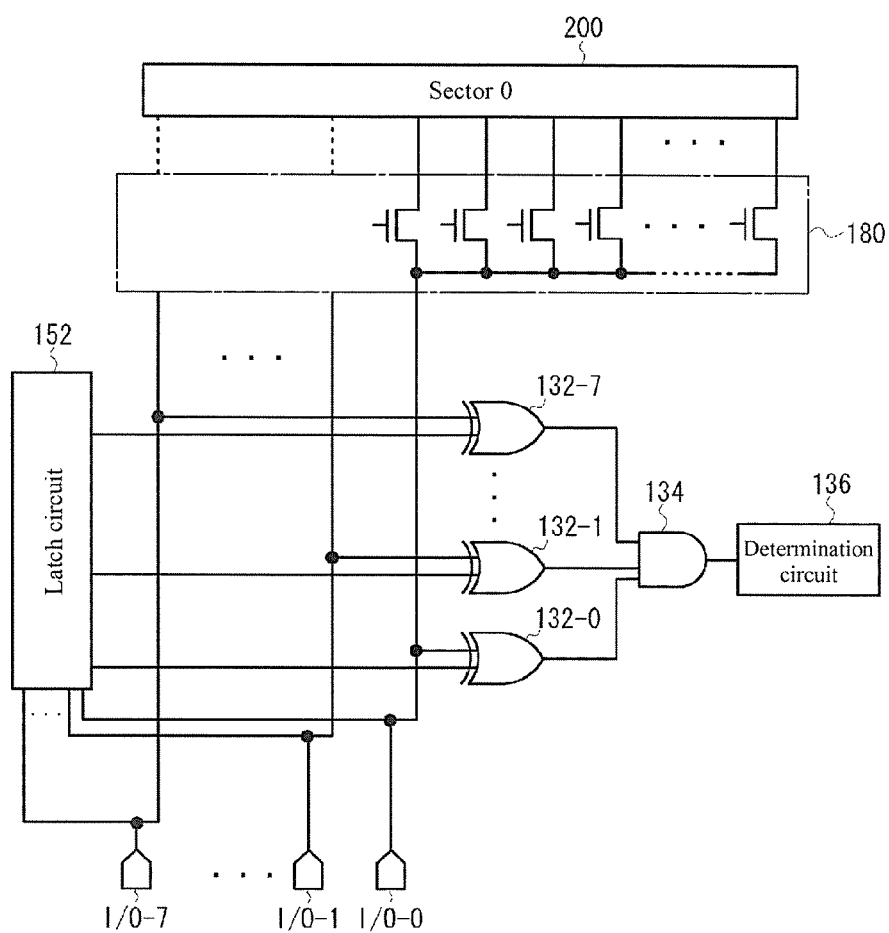
FIG. 11 is a diagram showing a structure for implementing the verification method for input data according to the second embodiment of the invention.

In one preferred embodiment, the test is implemented using sector of the page buffer/sensing unit 170 as a unit. FIG. 11 shows an example for loading the test data from the external input/output terminals I/O-0 to I/O-7 to Sector 0 of the page buffer/sensing circuit 170. For example, when one sector is 256 bytes, the test data is taken inside from external input/output terminals I/O-0 to I/O-7 within 256 data input cycles. There are eight input/output lines (24A, 24B) connected to the external input/output terminals I/O-0 to I/O-7, respectively. The eight input/output lines are connected to the latch circuit 152, and connected to Sector 0 via the column selection circuit 180. The column selection circuit 180 includes a plurality of selection transistors for selecting the column address. For example, there are 256 selection transistors connected to one input/output line (24A, 24B). The column selection circuit 180 can turn on any one of the 256 selection transistors according to the column address in order to connect the input/output line (24A, 24B) to the selected column address. In the test mode, the column address may be incremented through an address counter rather than limited to be inputted externally.

When the test data of 8 bit is inputted, each of the comparison circuits 132-0, 132-1, . . . , 132-7 compares the test data held in the latch circuit 152 with the test data read from Sector 0 to the output line 24B, and provides a comparison result thereof to an AND circuit 134. Each time when the test data 8 bit is inputted, the AND circuit 134 outputs the comparison results to a determination circuit 136. After loading of all the test data of Sector 0 is completed, the determination circuit 136 determines whether any circuit of Sector 0 is malfunction, or whether the transmission path of Sector 0 is malfunction. Thereafter, the same processing is also applied to Sector 1, Sector 2, . . . , Sector 7. Naturally, other than determining whether there is malfunction using sector as a unit, a determination result may also provided by the determination circuit 136 after loading of the test data is completed for all the sectors.

As such, according to the present embodiment, whether the page buffer/sensing circuit or the transmission path thereof is malfunction may be easily and rapidly determined without using equipments like a tester.

The preferable embodiment of the invention had been described in detail above, but the invention is not limited to a specific embodiment. It will be apparent to those skilled in the art that various modifications and variations can be made to the structure of the present invention without departing from the scope or spirit of the invention.

What is claimed is:

1. A semiconductor memory device, comprising:
an external terminal;
a memory array;
a data holding component, holding input data inputted from the external terminal; and
a comparison component, comparing the input data held in the data holding component from the external terminal with the input data read from the data holding component,
wherein the data holding component is configured to program the held input data to the memory array in response to determining that the input data held in the data holding component from the external terminal is consistent with the input data read from the data holding component.

2. The semiconductor memory device according to claim 1, wherein the comparison component is operated when programming the input data.

3. The semiconductor memory device according to claim 1, wherein the comparison component compares the input data of a same column address of the data holding component.

4. The semiconductor memory device according to claim 1 wherein the data holding component is connected to the external terminal via an input line and an output line, and
the comparison component compares the input data transmitted on the input line (24A) with the input data transmitted on the output line.

5. The semiconductor memory device according to claim 1, wherein the comparison component is operated in a test mode.

6. The semiconductor memory device according to claim 1 wherein the semiconductor memory device further comprises: a determination component, determining whether the data holding component is malfunction based on a comparison result of the comparison component.

7. The semiconductor memory device according to claim 1 wherein the semiconductor memory device further comprises a control component for controlling operations of the semiconductor storage device, the control component comprising a holding circuit capable of holding a command inputted from the external terminal, the comparison component comparing the input data held in the holding circuit with the input data read from the data holding component.

8. The semiconductor memory device according to claim 6 wherein the control component re-inputs the data held in the holding circuit to the data holding circuit when the data are determined as inconsistent by the comparison component.

9. A verification method for input data, that is a verification method for input data of a semiconductor storage device, the semiconductor storage device comprising an external terminal, a data holding component holding input data inputted from the external terminal, and a memory array component connected to the data holding component, the verification method for input data comprising steps of:
loading the input data from the external terminal to the data holding component;
reading the input data loaded in the data holding component;
comparing the input data held in the data holding component with the input data read from the data holding component; and
programming the held input data to the memory array in response to determining that the input data held in the data holding component from the external terminal is consistent with the input data read from the data holding component.

10. The verification method for input data according to claim 9, wherein the step of comparing is performed when programming the input data.

11. The verification method for input data according to claim 9 wherein the step of loading and the step of reading are performed in one data input cycle.

12. The verification method for input data according to claim 9, wherein the step of comparing is performed in a test mode.

13. The verification method for input data according to claim 12, wherein the verification method further comprises a step of determining whether the data holding component is malfunction based on a comparison result of the step of comparing.

14. The verification method for input data according to claim 9, wherein the step of loading comprises a step of holding the input data transmitted on an input line, and the step of comparing compares the held input data with the input data read from the data holding component.

15. The verification method for input data according to claim 14, further comprising a step of
re-inputting the data held by the step of holding to the data holding circuit when the input data are determined as inconsistent by the step of comparing.

16. A semiconductor memory device, comprising:
an external terminal;
a memory array;
a latch circuit, coupled to the external terminal and configured to hold input data inputted from the external terminal;
a page buffer/sensing circuit, coupled to the external terminal and configured to load the input data from the external terminal during an idle state of the latch circuit; and
a comparator, comparing the input data held in the latch circuit with the input data read from the page buffer/sensing circuit,
wherein the page buffer/sensing circuit is configured to reload the input data from the external terminal in response to determining that the input data held in the latch circuit is inconsistent with the input data read from the page buffer/sensing circuit,
wherein the page buffer/sensing circuit is configured to program the input data to the memory array in response to determining that the input data held in the latch circuit is consistent with the input data read from the page buffer/sensing circuit.

\* \* \* \* \*